United States Patent
Peng et al.

(10) Patent No.: US 8,309,885 B2
(45) Date of Patent: Nov. 13, 2012

(54) PULSE TEMPORAL PROGRAMMABLE ULTRAFAST BURST MODE LASER FOR MICROMACHINING

(75) Inventors: Xiaoyuan Peng, Portland, OR (US); Andrew Hooper, Beaveton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 911 days.

(21) Appl. No.: 12/354,373

(22) Filed: Jan. 15, 2009

(65) Prior Publication Data
US 2010/0177794 A1    Jul. 15, 2010

(51) Int. Cl.
*B23K 26/06* (2006.01)

(52) U.S. Cl. ......... 219/121.73; 219/121.76; 219/121.78

(58) Field of Classification Search ............. 219/121.73, 219/121.76, 121.78, 121.81, 121.83
See application file for complete search history.

(56) References Cited

U.S. PATENT DOCUMENTS

| | | |
|---|---|---|
| 4,114,018 A | 9/1978 | Von Allmen et al. |
| 5,742,634 A | 4/1998 | Rieger et al. |
| 6,281,471 B1 | 8/2001 | Smart |
| 6,462,307 B1 | 10/2002 | Hennig et al. |
| 6,552,301 B2 | 4/2003 | Herman et al. |
| 6,574,250 B2 | 6/2003 | Sun et al. |
| 7,256,930 B2 | 8/2007 | Liu |
| 7,348,516 B2 | 3/2008 | Sun et al. |
| 7,420,995 B2 | 9/2008 | Sun |
| 7,491,909 B2 | 2/2009 | Yamamoto et al. |
| 7,616,669 B2 | 11/2009 | Grant et al. |
| 7,732,731 B2 | 6/2010 | Gu |
| 2004/0134894 A1 | 7/2004 | Gu et al. |
| 2005/0041702 A1 | 2/2005 | Fermann et al. |
| 2006/0056468 A1 | 3/2006 | Dantus et al. |
| 2006/0159138 A1 | 7/2006 | Deladurantaye et al. |
| 2006/0187974 A1 | 8/2006 | Dantus |
| 2007/0199927 A1 | 8/2007 | Gu et al. |
| 2007/0272668 A1 | 11/2007 | Albelo et al. |
| 2008/0170218 A1* | 7/2008 | Dantus et al. ........ 356/39 |
| 2009/0141750 A1 | 6/2009 | Sun et al. |
| 2009/0245301 A1 | 10/2009 | Peng et al. |
| 2009/0245302 A1 | 10/2009 | Baird et al. |
| 2010/0118899 A1 | 5/2010 | Peng et al. |

FOREIGN PATENT DOCUMENTS

| | | |
|---|---|---|
| JP | 2008521611 | 6/2008 |
| JP | 2008207210 | 11/2008 |

OTHER PUBLICATIONS

Nebel, Achim et al, Generation of Tailored Picosecond-Pulse-Trains for Micro-Machining; Phototonics West 2006, LASE Conference: Commercial and Biomedical Applications of Ultrafast Lasers VI; Paper No. 6108-37.

Search Report and Written Opinion for PCT/US2010/020364, mailed Jul. 27, 2010.

* cited by examiner

*Primary Examiner* — M. Alexandra Elve
(74) *Attorney, Agent, or Firm* — Stoel Rives LLP

(57) ABSTRACT

A laser processing system provides a burst of ultrafast laser pulses having a selectively shaped burst envelope. A burst pulse laser includes a high repetition rate ultrafast laser to deliver a pulse train with each pulse in the train having an independently controlled amplitude. The respective amplitudes of each ultrafast pulse in a group define a "burst envelope." In addition to independently controlling the amplitude of each ultrafast pulse within the burst envelope, the system may also provide selective control of spacing between each ultrafast pulse and/or the overall temporal width of the burst envelope. Thus, the system provides selective shaping of the burst envelope for particular laser processing applications.

19 Claims, 5 Drawing Sheets

PULSE TEMPORAL PROGRAMMABLE ULTRAFAST BURST MODE LASER FOR MICROMACHINING

TECHNICAL FIELD

The present disclosure relates to laser micromachining. In particular, the present disclosure relates to laser systems and methods that use a burst of ultrafast laser pulses.

BACKGROUND INFORMATION

After manufacture of a semiconductor memory array chip is complete, integrated circuit (IC) patterns on an exposed surface of the chip are sealed with an electrically insulating layer of passivating material. Typical passivating materials include resins or thermoplastic polymers such as, for example, polyimide. The purpose of this final "passivation" layer is to prevent the surface of the chip from reacting chemically with ambient moisture, to protect the surface from environmental particulates, and to absorb mechanical stress. Following passivation, the chip is mounted in an electronic package embedded with metal interconnects that allow probing and functional testing of the memory cells. When one of many redundant memory cells is determined to be faulty, the cell is disabled by severing the conductive interconnects, or wires, linking that cell to its neighbors in the array. Disabling individual memory cells by "link processing" or "link blowing" is accomplished by laser micromachining equipment that is capable of directing laser beam energy so as to selectively remove the link material in a highly localized region without imparting damage to the materials adjacent to, below, or above the target. Selectively processing a designated link may be achieved by varying the laser beam wavelength, spot size, pulse repetition rate, pulse shape, or other spatial or temporal beam parameters that influence energy delivery.

Laser micromachining processes that entail post-processing of electrically conductive links in memory arrays or other types of IC chips use sharp pulses with a fast rising front edge (e.g., with a 1-2 nanosecond rise time) to achieve desired quality, yield, and reliability. To cleanly sever a link, the laser pulse penetrates the overlying passivation layer before cutting through the metal interconnect. The rising edge of a typical pulse from an existing solid-state laser varies with pulse width. Use of a traditional Gaussian-shaped laser pulse having a 5-20 nanosecond pulse width and a sloped, gradually rising front edge in link processing tends to cause an "over crater" in the passivation layer, especially if its thickness is too large or is uneven. Over cratering reduces the reliability of IC chips.

Rupture behavior of overlying passivation layers has been well analyzed by Yunlong Sun in his PhD dissertation entitled, "Laser processing optimization of semiconductor based devices" (Oregon Graduate Institute, 1997). Because passivation layer thickness is an important parameter, the optimal thickness of a particular passivation layer material may be determined by simulations based on Sun's analysis. Difficulty in maintaining wafer-level process control of the passivation layer during IC fabrication may result in non-optimal thickness and poor cross-wafer or wafer-to-wafer thickness uniformity. Therefore, optimizing characteristics of laser pulses used in post-processing may help to compensate for mis-targeted dimensions and sources of variation in the passivation layer.

U.S. Pat. No. 6,281,471 of Smart proposes using substantially square-shaped laser pulses for link processing. Such a sharp-edged pulse may be generated by coupling a master oscillator laser with a fiber amplifier (MOPA). This low power master oscillator employs a diode laser that is capable of generating a square-shaped pulse with a fast rise time. On the other hand, U.S. Pat. No. 7,348,516 of Yunlong Sun et al., which patent is assigned to the assignee of this patent application, states that, despite a vertical rising edge, a substantially square-shaped laser pulse is not the best laser pulse shape for link processing. Instead, Sun, et al. describes use of a specially tailored laser pulse shape that, in one embodiment, resembles a chair, with a fast rising peak or multiple peaks to most effectively process links, followed by a drop-off in signal strength that remains relatively flat at a lower power level before shutting off. Such a tailored laser pulse, with high peak power but low average power, has been successfully generated by what is called pulse slicing technology, which can be implemented by either electro-optical modulation (EOM) or acousto-optical modulation (AOM). For example, a conventional active Q-switched solid-state laser provides nanosecond seed pulses with high intensity and high pulse energy, and then a light-loop slicing device transforms a standard laser pulse into a desired tailored pulse shape.

U.S. patent application Ser. No. 12/057,264, of Xiaoyuan Peng et al., which application is assigned to the assignee of the present patent application, teaches a light-loop slicing scheme implemented, for example, in an ultraviolet (UV) laser system for semiconductor link processing. Alternatively, a specially tailored laser pulse may be generated by a MOPA that employs a gain fiber as the power amplifier. Using a MOPA is advantageous in that it constitutes a stable signal source at a specified constant frequency.

U.S. Patent Application No. 2006/0159138 of Pascal Deladurantaye describes a shaped-pulse laser in which two modulators shape a continuous wave (CW) light beam to generate various shaped pulses. However, generating a pulsed laser from a CW light beam is fairly inefficient, and thus requires more amplification. Because such a low peak-power signal may be influenced by noise, which causes pulse-to-pulse instability, the two modulators are preferably synchronized to maintain pulse stability and energy stability, thereby adding further complexity and cost.

The above systems and methods generally use laser pulses with pulse widths in the nanosecond range. However, the 1 μm and 1.3 μm laser wavelengths with pulse widths in the nanosecond range have disadvantages. For example, the energy coupling efficiency of such infrared (IR) laser beams into a highly electrically conductive metallic link is relatively poor. Further, the practical achievable spot size of an IR laser beam for link severing is relatively large and limits the critical dimensions of link width, and link pitch. As has been discussed in detail by Yunlong Sun, "Laser Processing Optimization for Semiconductor Based Devices" (unpublished doctoral thesis, Oregon Graduate Institute of Science and Technology, 1997), conventional laser link processing with nanosecond pulse width may rely on heating, melting, and evaporating the link, and creating a mechanical stress build-up to explosively open the overlying passivation layer with a single laser pulse. Such a conventional link processing laser pulse creates a large heat affected zone (HAZ) that could deteriorate the quality of the device that includes the severed link. For example, when the link is relatively thick or the link material is too reflective to absorb an adequate amount of the laser pulse energy, more energy per laser pulse is used to sever the link. Increased laser pulse energy increases the damage risk to the IC chip, including irregular or over sized opening in the overlying passivation layer, cracking in the underlying passivation layer, damage to the neighboring link structure and damage to the silicon (Si) substrate. However, using laser pulse energy within a risk-free range on thick links often results in incomplete link severing.

Thus, investigations have been performed for using ultrafast lasers (either picosecond or femtosecond lasers) to process semiconductor materials such as links in IC chips. However, the high peak power of a single ultrafast pulse may easily damage the underlying Si substrate, which is unacceptable in many applications. One solution to the problem of high peak power substrate damage caused by ultrafast lasers is to use a burst or train of ultrafast pulses with smaller peak powers. A pulse train also has the effect of producing a smaller effective spot size in the material. A problem with using a train of ultrafast pulses is that many commercially available ultrafast lasers that use a pulse picker have pulse repetition rates in the kilohertz range. Without the pulse picker, a mode-locked laser runs at a fixed repetition rate that is typically in the tens of megahertz range. Such a repetition rate may be difficult to apply to links because stage movement is typically approximately 400 mm/s such that the laser spot may move off a targeted link in less than approximately 500 nanoseconds. Thus, lasers used for pulse train applications may require pulse repetition rates starting at approximately 100 MHz.

U.S. Patent Application No. 2007/0199927, of Bo Gu et al., uses a laser with at least one pulse having a pulse duration in a range between approximately 10 picoseconds and less than approximately 1 nanosecond. Achim Nebel et al. from Lumera Laser GmbH have demonstrated a passively mode-locked laser that uses digital timing control to generate sequences or groups of pulses. See, "Generation of Tailored Picosecond-Pulse-Trains for Micro-Machining," Photonics West 2006, LASE Conference: Commercial and Biomedical Applications of Ultrafast Lasers VI Paper No. 6108-37. The system taught by Achim Nebel et al. is based on a "double-switch" scheme generated by high-voltage electro-optical (EO) pulse-picker that drives a voltage passing a half wave of a Pockels cell and generates two HV pulses in one cycle. The delay time between groups of pulses is changeable. This feature provides certain flexibility for material processing. However, the envelope of a burst of pulses is not capable of being changed, which limits use of the system in various micromachining applications. In addition, the solution provided by Achim Nebel et al. is large and costly. The mechanical and thermal requirements are fairly high due to a long cavity length, which is generally more than 1 meter for an 80 MHz mode-locked cavity.

SUMMARY OF THE DISCLOSURE

In one embodiment, a laser system is configured for processing a material with a selectively shaped burst of ultrafast laser pulses. The system includes a burst pulse laser configured to emit a burst of three or more laser pulses defined by a selectively shaped burst envelope. The burst pulse laser is further configured to selectively adjust temporal spacing between the three or more laser pulses within the burst envelope and the temporal width of the burst envelope. The system also includes one or more amplifiers configured to amplify the group of three or more laser pulses so as to obtain a desired shape of the burst envelope. In certain embodiments, the burst pulse laser includes a laser source configured to emit a train of laser pulses, and an optical modulator that receives the train of laser pulses. The optical modulator is configured to amplitude modulate the train of laser pulses so as to generate the burst of three or more laser pulses defined by the selectively shaped burst envelope.

In another embodiment, a method for processing a material with a selectively shaped burst of ultrafast laser pulses includes providing a train of laser pulses at a first repetition rate, modulating the train of laser pulses based on a selectively shaped burst envelope, and selectively adjusting the spacing between the three or more laser pulses within the burst envelope. The modulation includes amplitude adjusting three or more laser pulses within the burst envelope.

Additional aspects and advantages will be apparent from the following detailed description of preferred embodiments, which proceeds with reference to the accompanying drawings.

DETAILED DESCRIPTION OF PREFERRED EMBODIMENTS

Figure 1:
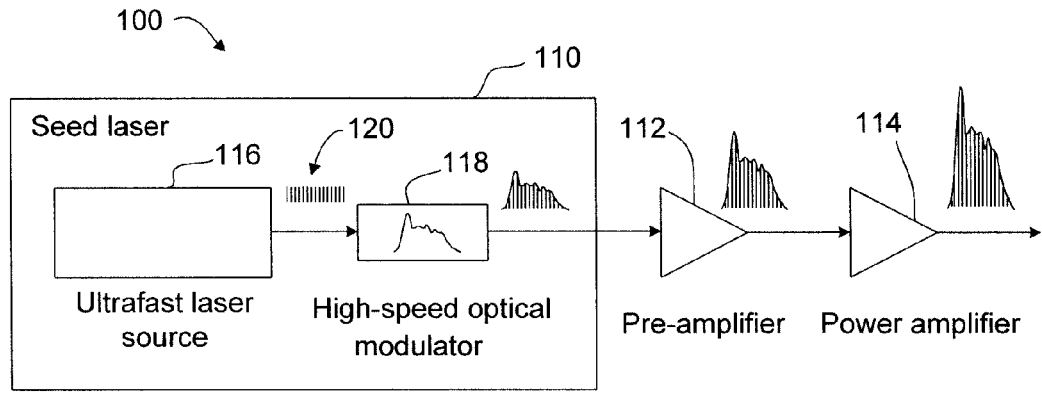
FIG. 1 is a block diagram of a laser system having a programmable burst pulse laser according to one embodiment.

A laser processing system according to one embodiment generates ultrafast laser pulses with a temporal programmable burst mode. A burst pulse laser includes a high repetition rate ultrafast laser configured to deliver a pulse train with each pulse in the train having an independently controlled amplitude. The respective amplitudes of each ultrafast pulse in a group or "burst" of pulses, along with the spacing between pulses, define a "burst envelope." In addition to independently controlling the amplitude of each ultrafast pulse in a burst of pulses, the system may also provide selective control of spacing between each ultrafast pulse and/or the overall temporal width of the burst envelope. Thus, the system provides selective shaping of the burst envelope for particular laser processing applications. Because each ultrafast pulse within the group of pulses may have a temporal width in a picosecond range, or even a femtosecond range, the laser system may be used, for example, for efficient and high quality material processing.

In certain embodiments, as discussed in detail below, the laser system includes a seed laser having an ultrafast laser source and a high-speed optical modulator to shape the burst envelope. The laser system also includes one or more amplifier stages to amplify the shaped burst of laser pulses before the system applies it to a work surface. The ultrafast laser source may include a semiconductor laser, a fiber laser, or a solid-state laser. In certain embodiments, the ultrafast laser source may be a linearly polarized, narrow bandwidth source. Thus, the system may use harmonic generation to provide shorter wavelengths and/or Raman and optical parametric generation (OPO) to provide longer wavelengths. The programmable shape may be obtained by using, for example, pulse picking, high-speed modulation, seed source electrical modulation in the case of semiconductor gain-switched ultrafast laser, or a combination of the foregoing. A pre-amplifier may include, for example, photonic crystals, a large mode area (LMA) gain fiber, or a single mode gain fiber. A post amplifier (power amplifier) may include, for example, a solid-state gain medium. As discussed below, in certain embodiments, the pre-amplifier and post amplifier may include any combination of fiber or solid-state amplifiers. The embodiments disclosed herein provide a versatile ultrafast laser source for high quality material processing in many different applications.

Reference is now made to the figures in which like reference numerals refer to like elements. For clarity, the first digit of a reference numeral indicates the figure number in which the corresponding element is first used. In the following description, numerous specific details are provided for a thorough understanding of the embodiments disclosed herein. However, those skilled in the art will recognize that the embodiments described herein can be practiced without one or more of the specific details, or with other methods, components, or materials. Further, in some cases, well-known structures, materials, or operations are not shown or described in detail in order to avoid obscuring aspects of the embodiments. Furthermore, the described features, structures, or characteristics may be combined in any suitable manner in one or more embodiments.

FIG. 1 is a block diagram of a laser system 100 according to one embodiment. The laser system 100 includes a seed laser 110, a pre-amplifier 112, and a power amplifier 114. The seed laser 110 includes an ultrafast laser source 116 and a high-speed optical modulator 118. The ultrafast laser source 116 provides a train of ultrafast laser pulses 120 to the high-speed optical modulator 118. In one embodiment, the temporal pulse width of each ultrafast laser pulse 120 is in a range between approximately 300 femtoseconds and approximately 1 nanosecond.

The ultrafast laser source 116 provides the ultrafast laser pulses 120 at a high repetition rate. In one embodiment, the ultrafast laser source 116 operates at a repetition rate in a range between approximately 1 Hz and approximately 100 kHz. In other embodiments, the repetition rate is in a range between approximately 100 kHz and approximately 80 MHz. An artisan will recognize from the disclosure herein that much higher repetition rates may also be used. For example, in some embodiments repetition rates as high as 500 MHz or higher may be used. In another embodiment, repetition rates may be as high as approximately 10 GHz or higher.

Figure 2:
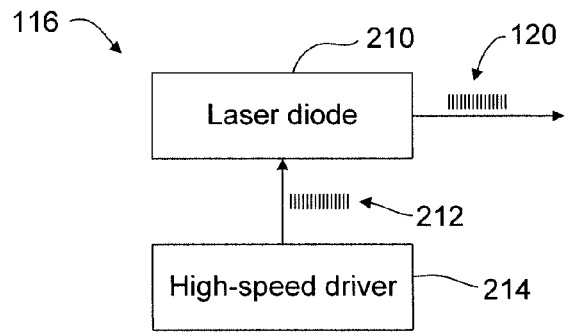
FIG. 2 is a block diagram of an ultrafast laser source according to one embodiment that includes a high-speed distributed feedback diode.

In one embodiment, the ultrafast laser source 116 includes a high-speed ultrafast semiconductor diode. For example, FIG. 2 is a block diagram of an ultrafast laser source 116 according to one embodiment that includes a high-speed distributed feedback (DFB) diode 210. The DFB diode 210 is modulated by a seed pulse signal 212 produced by a high-speed driver 214 to provide at a high repetition rate the train of ultrafast laser pulses 120. In certain embodiments, the laser source 116 includes an optical modulator. For example, the laser source 116 may include a 20 GHz bandwidth modulator capable of providing 50 picosecond pulse widths. An artisan will recognize from the disclosure herein that the optical modulator may operate above or below 20 GHz. For example, in one embodiment the optical modulator may operate at a bandwidth of up to approximately 40 GHz.

Using the DFB diode 210 as the laser source 116 offers wide tunability, narrow linewidth, and high output power in a compact and very rugged setup. For example, a frequency selective element (not shown) within the DFB diode 210, such as a Bragg grating, is integrated into the active section of the semiconductor. Thus, single-frequency operation and high coherence (e.g., a coherence length in a range between approximately 50 m and approximately 200 m) are obtained without any bulk optics, making the DFB diode 210 particularly suitable for use within harsh industrial environments or for airborne applications.

The DFB diode 210 shown in FIG. 2 may be tuned according to certain embodiments by changing either the temperature (e.g., typically at a tuning rate of approximately 25 GHz/K) or the operating current (e.g., typically at a tuning rate of approximately 1 GHz/mA to approximately 2 GHz/mA). While current-tuning is favorable for rapid modulation tasks, thermal tuning has the advantage of providing extremely large mode-hop free tuning ranges (e.g., up to approximately 1200 GHz). Generally, the wavelength of a DFB laser is tuned by varying the laser current or the chip temperature. Electric modulation is suitable for fast frequency scans within a small range (e.g., for linewidths in a range between approximately 0.1 nm and approximately 0.2 nm at modulation frequencies in the kHz to MHz range). Larger tuning ranges of up to approximately 3 nm are realized by varying the laser temperature, typically over an interval of approximately 40° C.

By way of example, the DFB diode 210 may be a DFB diode equipped with polarization maintaining (PM) fiber couplers (not shown) may be obtained from Toptica Photonics, AG of Munich, Germany. As another example, the diode 210 may include an ultrafast gain-switched diode with a direct modulated source providing 50 picosecond pulse widths, as demonstrated by PicoQuant GmbH, of Berlin, Germany.

Figure 3:
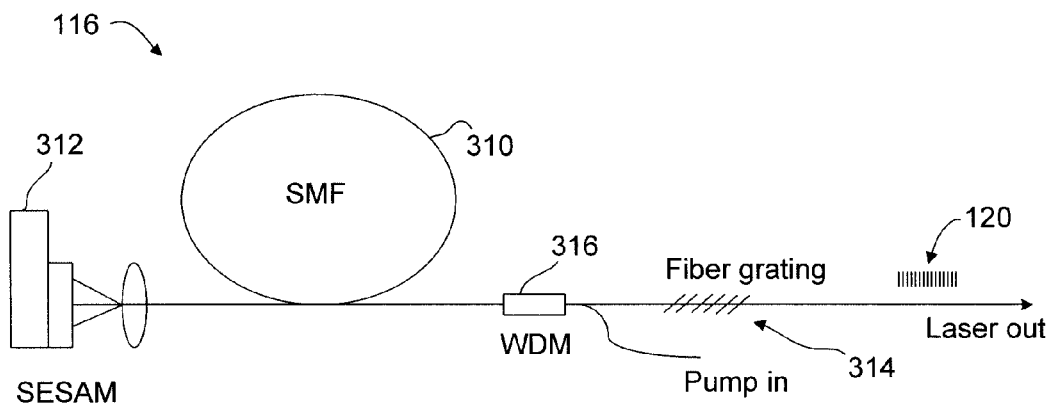
FIG. 3 is a block diagram of a typical fiber mode-locked master oscillator that may be used as the ultrafast laser source of FIG. 1 according to one embodiment.

Returning to FIG. 1, in other embodiments, the ultrafast laser source 116 may include a solid-state ultrafast laser, a passively mode-locked fiber master oscillator, a combination of multi-fiber master oscillators, a passively mode-locked semiconductor laser, or any other high repetition rate ultrafast laser. For example, FIG. 3 is a block diagram of a typical fiber mode-locked master oscillator that may be used as the ultrafast laser source 116 of FIG. 1 according to one embodiment. In the example shown in FIG. 3, the fiber mode-locked master oscillator includes a single mode gain fiber (SMF) 310 that forms a laser resonator terminated on one end by a semiconductor saturable absorber mirror (SESAM) 312 and on the other end by wavelength selector such as a fiber grating 314. The gain fiber 310 is pumped by, for example, a laser diode (not shown), the output of which is introduced to the resonator through a wavelength division multiplexer (WDM) 316. In operation, the fiber mode-locked master oscillator shown in FIG. 3 generates the train of ultrafast laser pulses 120 at a high repetition rate, as discussed above. The pulse repetition rate of the fiber mode-locked master oscillator is determined by the resonator's length.

As shown in FIG. 1, the train of ultrafast laser pulses 120 is provided to the high-speed optical modulator 118, which independently adjusts the amplitude of each pulse so as to obtain a desired burst envelope shape for a particular material processing application. The high-speed optical modulator 118 may be programmed to control the temporal spacing of the ultrafast pulses under the envelope, the burst envelope's temporal width, and/or the burst envelope's amplitude and particular shape. The programmable burst envelope may be obtained by using, for example, pulse picking (e.g., selecting pulses so as to control the distance between pulses or the pulse repetition frequency), high-speed modulation, seed source electrical modulation in the case of semiconductor gain-switched ultrafast laser, or a combination of the foregoing. In one embodiment, the high-speed optical modulator 118 includes a Mach-Zehnder interferometer (not shown) that modulates the power of the train of ultrafast laser pulses to obtain a desired burst envelope.

The temporal width of the burst envelope according to one embodiment is in a range between approximately 10 picoseconds and approximately 1 nanosecond. In other embodiments, the temporal width of the burst envelope is in a range between approximately 1 nanosecond and approximately 10 nanoseconds. In other embodiments, the temporal width of the burst envelope is in a range between approximately 10 nanoseconds and approximately 100 nanoseconds. In other embodiments, the temporal width of the burst envelope is in a range between approximately 100 nanoseconds and approximately 1 microsecond. The burst envelope may have other temporal widths depending on the particular application.

In one embodiment, the rise time and/or fall time of the burst envelope is less than 1 nanosecond. For example, the rise time and/or fall time may be in a range between approximately 10 picoseconds and approximately 1 nanosecond. Faster or slower rise/fall times may also be used for different applications. For example, the rise time and/or fall time may be in a range between approximately 1 nanosecond and approximately 5 nanoseconds. The laser system's ability to a provide burst envelope with a fast rise time and/or fall time is useful, for example, to link severing applications because it reduces the risk of generating over craters in the overlying passivation layer.

The pre-amplifier 112 and the power amplifier 114 provide appropriate amplification to the shaped burst of ultrafast laser pulses provided at the output of the high-speed optical modulator 118. The pre-amplifier 112 according to certain embodiments may include photonic crystals, LMA gain fiber, or single mode gain fiber. In addition, or in other embodiments, the power amplifier 114 includes a solid-state gain medium. As discussed below, in certain embodiments, the pre-amplifier 112 and the power amplifier 114 may include any combination of fiber or solid state amplifiers.

Figure 4:
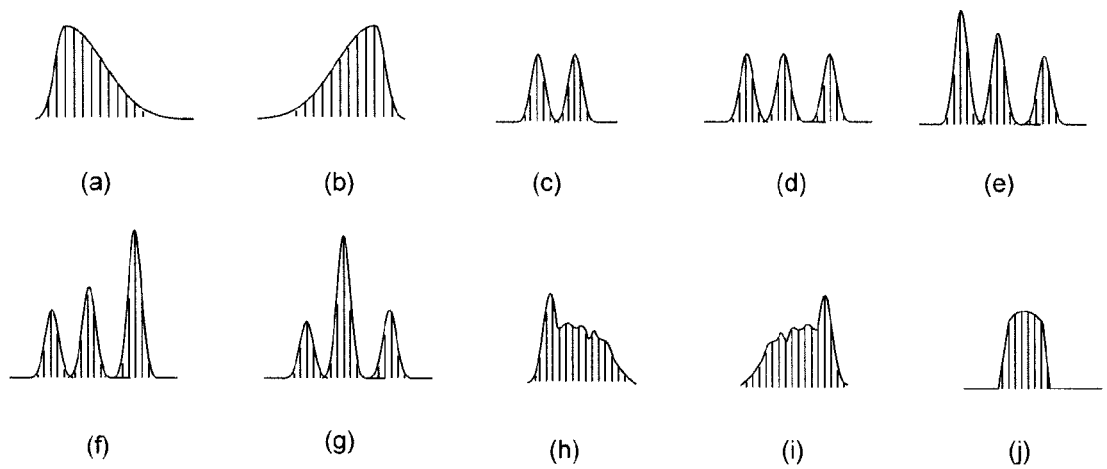
FIG. 4 graphically illustrates example burst envelopes that may be produced according to certain embodiments.

FIG. 4 graphically illustrates example burst envelopes that may be produced according to certain embodiments. While FIG. 4 illustrates ten different burst envelope shapes (a), (b), (c), (d), (e), (f), (g), (h), (i), and (j), an artisan will recognize that the illustrated shapes are provided by way of example only and that any number of different burst envelope shapes may be produced according to the systems and methods disclosed herein. Further, as discussed above, the selected envelope shape may be based on a particular material processing application.

For example, U.S. Pat. No. 7,348,516 of Yunlong Sun et al., which patent is assigned to the assignee of this patent application, describes the use of a specially tailored laser pulse shape that, in one embodiment, resembles a chair, with a fast rising peak or multiple peaks to most effectively process links, followed by a drop-off in signal strength that remains relatively flat at a lower power level before shutting off. Such a chair-shaped pulse corresponds to the burst envelope shape (h) shown in FIG. 4. In other material processing applications, multiple peaks may be used, such as shown in the burst envelope shapes (c), (d), and (e) in FIG. 4, to sequentially heat the material, remove a portion of the material to create a kerf, and clean out the kerf. Because the ultrafast laser source 116 combined with the high-speed optical modulator 118 is capable of providing various pulse shapes containing ultrafast pulses in the envelope with fine structures, many other burst envelope shapes for many different applications will occur to those skilled in the art based on the embodiments herein.

Figure 5:
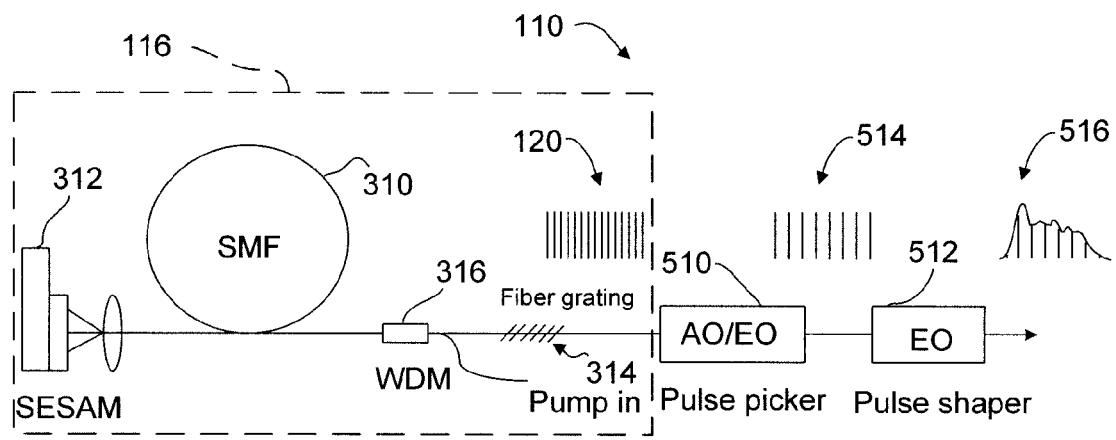
FIG. 5 is a block diagram of a seed laser usable by the laser system to generate shaped burst envelopes according to one embodiment.

FIG. 5 is a block diagram of a seed laser 110 usable by the laser system 100 to generate shaped burst envelopes according to one embodiment. The seed laser 110 shown in FIG. 5 includes an ultrafast laser source 116, a pulse picker 510, and a pulse shaper 512. The ultrafast laser source 116 in this embodiment is a fiber mode-locked master oscillator that includes, as discussed above in relation to FIG. 3, the SMF 310, the SESAM 312, the fiber grating 314, and the WDM 316.

The pulse picker 510 may include, for example, an acousto-optical (AO) modulator or an electro-optical (EO) modulator that is configured to change the repetition rate of the train of ultrafast pulses 120. As mentioned above, the main mode-lock frequency is determined by the resonator's length, which is fixed for a given oscillator. For example, the mode lock frequency may be approximately 1 GHz, which may not be ideal for processing certain materials. Thus, the pulse picker 510 passes the pulses provided by the fiber mode-locked master oscillator at a selected rate to lower the repetition rate (e.g., to change it from approximately 1 GHz to approximately 500 MHz or to a much lower rate such as to a few Hertz), as represented in FIG. 5 by the train of ultrafast laser pulses 514. As another example, additional temporal delay may be added between two ultrafast laser pulses in a burst to allow heat dissipation. Thus, the pulse picker 510 may be used to selectively change the spacing between ultrafast laser pulses to control heating during material processing.

The pulse shaper 512 may include, for example, an EO modulator that is configured to selectively provide amplitude modulation to each pulse in the train of ultrafast laser pulses 514. Thus, the pulse shaper 512 selectively shapes the burst envelope 516, as shown in FIG. 5. As discussed in relation to FIG. 1, the shaped burst of laser pulses may then be provided to the pre-amplifier 112 and the power amplifier 114 before being applied to a workpiece.

Figure 6:
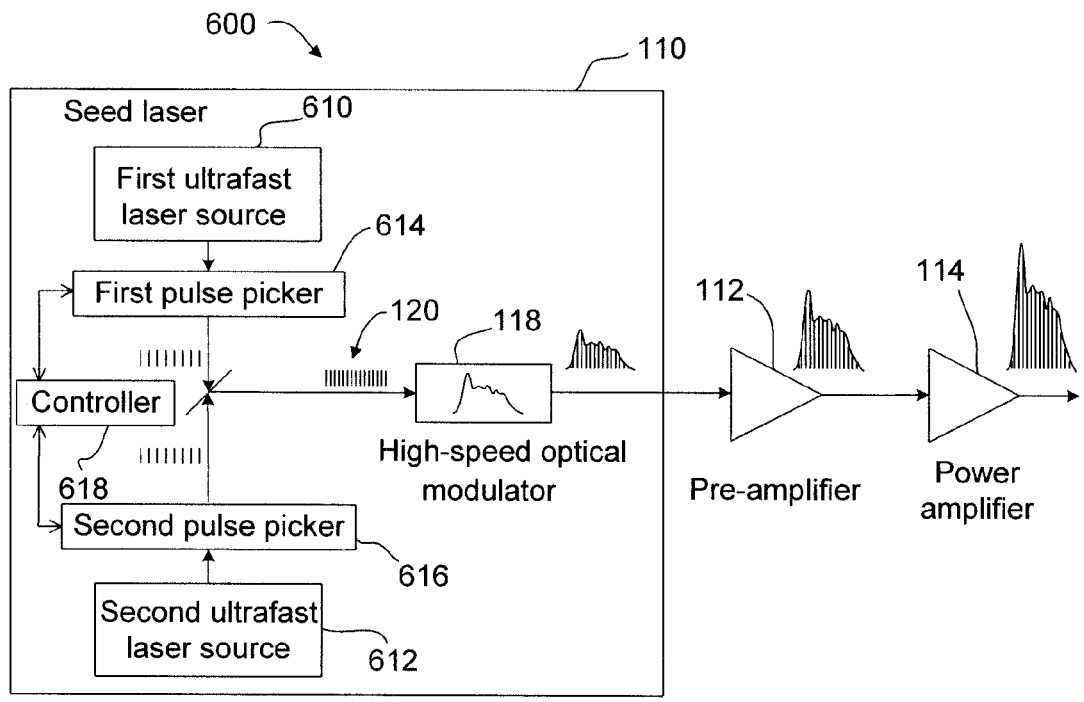
FIG. 6 is a block diagram of a laser system with a seed laser that selectively combines the outputs of a first ultrafast laser source and a second ultrafast laser source according to one embodiment.

Repetition rates may be increased and further controlled by selectively combining two or more ultrafast laser sources. For example, FIG. 6 is a block diagram of a laser system 100 with a seed laser 110 that selectively combines the outputs of a first ultrafast laser source 610 and a second ultrafast laser source 612 according to one embodiment. The outputs may be combined, for example, the increase the overall repetition rate of the train of ultrafast laser pulses 120 provided to the high-speed optical modulator 118.

The first ultrafast laser source 610 and the second ultrafast laser source 612 may each include any of the example ultrafast laser source embodiments discussed herein or otherwise known in the art. In one embodiment, a first pulse picker 614 may be used to selectively reduce the repetition rate of the first ultrafast laser source 610, and a second pulse picker 616 may be used to selectively reduce the repetition rate of the second ultrafast laser source 612. The seed laser 110 may also include a controller 618 in communication with the first pulse picker 614 and the second pulse picker 616 to selectively control the respective repetition rates. Thus, the controller 618 controls the overall repetition rate of the train of ultrafast laser pulses 120 as well as the temporal spacing between any two pulses within the train of ultrafast laser pulses 120. As discussed above, the train of ultrafast laser pulses is then provided to the high-speed optical modulator 118 for burst envelope shaping, the pre-amplifier 112, and the power amplifier 114.

Figure 7A:
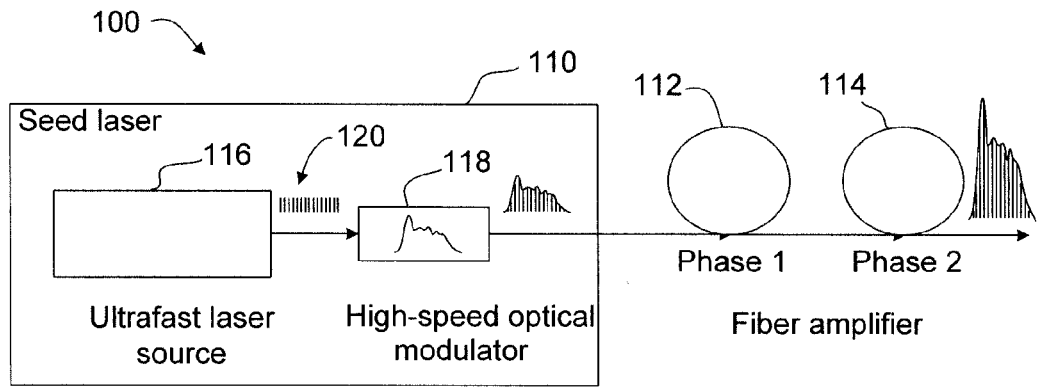
FIGS. 7A, 7B, and 7C are block diagrams of respective laser systems implementing different pre-amplifier (phase 1) and power amplifier (phase 2) configurations according to certain embodiments.
Figure 7B:
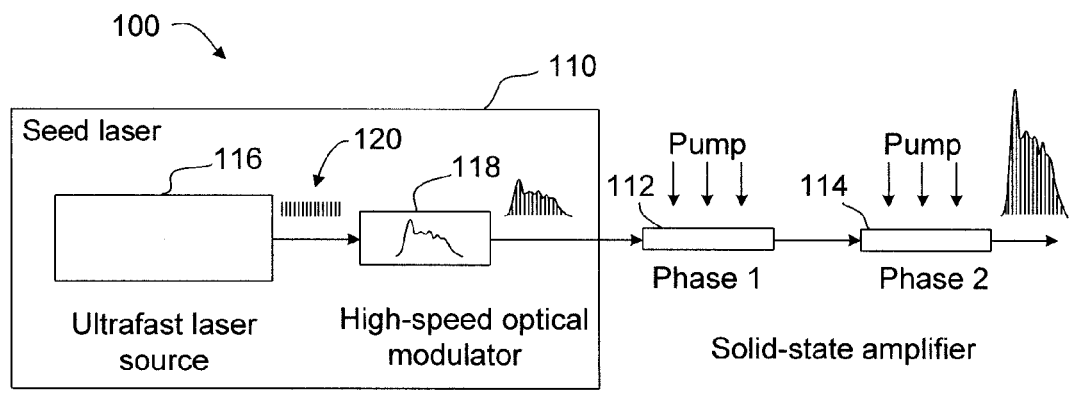
Figure 7C:
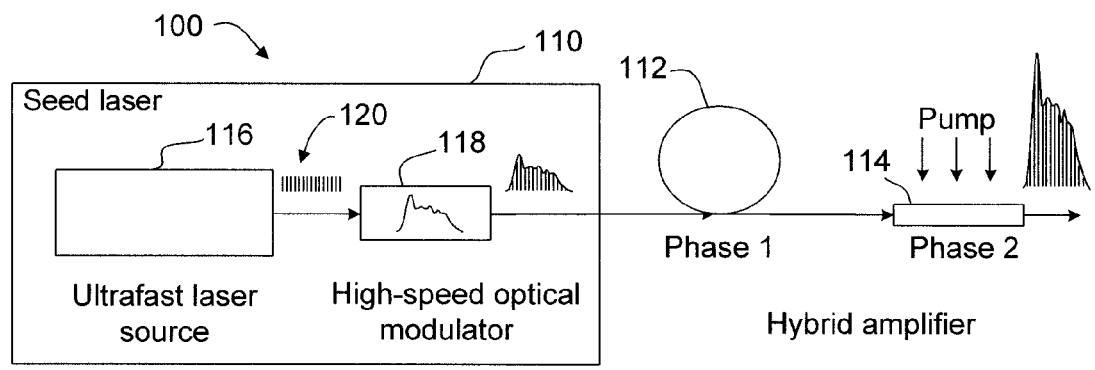

FIGS. 7A, 7B, and 7C are block diagrams of respective laser systems 100 implementing different configurations of pre-amplifiers 112 (phase 1) and power amplifiers 114 (phase 2) according to certain embodiments. The example embodiments shown in FIGS. 7A, 7B, and 7C each include the seed laser 110, as discussed above in relation to FIG. 1, to provide selectively shaped burst envelopes. In FIG. 7A, the pre-amplifier 112 and the power amplifier 114 each include one or more gain fiber amplifiers. In FIG. 7B, the pre-amplifier 112 and the power amplifier 114 each include one or more solid-state amplifiers. In FIG. 7C, a hybrid amplifier is used in which the pre-amplifier 112 includes one or more gain fiber amplifiers and the power amplifier 114 includes one or more solid-state amplifiers. Although not shown, in other embodiments, the hybrid amplifier shown in FIG. 7C may be reversed such that the pre-amplifier 112 includes solid-state amplifiers and the power amplifier 114 includes gain fiber amplifiers. In other embodiments, the pre-amplifier 112 and/or the power amplifier 114 may include a combination of gain fiber amplifiers and solid-state amplifiers. Each of the gain fiber amplifiers may include, for example, Ytterbium (Yb), Erbium (Er), or Neodymium (Nd) glass. While only two amplifier stages are shown in each embodiment, amplifier stages may be added to produce at least 1 kW of peak power output according to certain embodiments. The hybrid or "tandem" configurations are more robust at peak power levels greater than 1 kW because they include bulk solid-state amplifiers.

Figure 8:
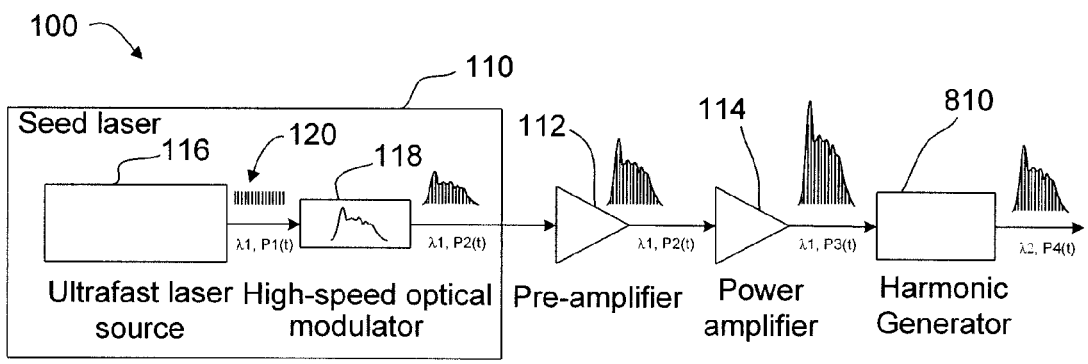
FIG. 8 is a block diagram of a laser system that includes a harmonic generator for wavelength conversion according to one embodiment.

FIG. 8 is a block diagram of a laser system 100 that includes a harmonic generator 810 for wavelength conversion according to one embodiment. The laser system 100 includes the seed laser 110 having the ultrafast laser source 116 as discussed above in relation to FIG. 1. The ultrafast laser source 116 may be a linearly polarized, narrow bandwidth source. For example, the ultrafast laser source 116 may have a bandwidth that is less than approximately 1 nm, and the amplifiers 112, 114 may be configured to maintain the polarization, which is suitable for nonlinear conversion to shorter wavelengths by harmonic generation or to longer wavelengths by Raman or OPO. Thus, the harmonic generator 810 may be used to obtain wavelength ranges such as green, ultraviolet (UV), or deep ultraviolet (DUV).

The embodiments disclosed herein provide some unique advantages for laser processing of materials including, for example, for processing of multi-layer semiconductor devices where the desire is to process one or more of these layers without causing damage to the device substrate. Conventional nanosecond laser pulses may not be suitable for processing of sub-micron sized features in layered semiconductor devices because the resulting heat affected zone is large and may damage adjacent and underlying structures. Conventional picosecond lasers may also not be suitable for processing of semiconductor layers because the large peak powers required may cause significant heating to the underlying substrate. Thus, the burst pulse laser 110 disclosed herein combines the useful features of both nanosecond and picosecond pulse types.

By way of illustration of some of the advantages of the embodiments disclosed herein, FIGS. 9A, 9B, 9C, and 9D illustrate various examples of the interaction of a laser beam 910 with a workpiece 912. As discussed below, the illustrated examples show that a burst pulse allows maximum flexibility for control of the pulse peak power, heat affected zone, and heating of adjacent and underlying structures. The thermal profile in the material may be more effectively controlled using a selectively shaped burst envelope.

Figure 9A:
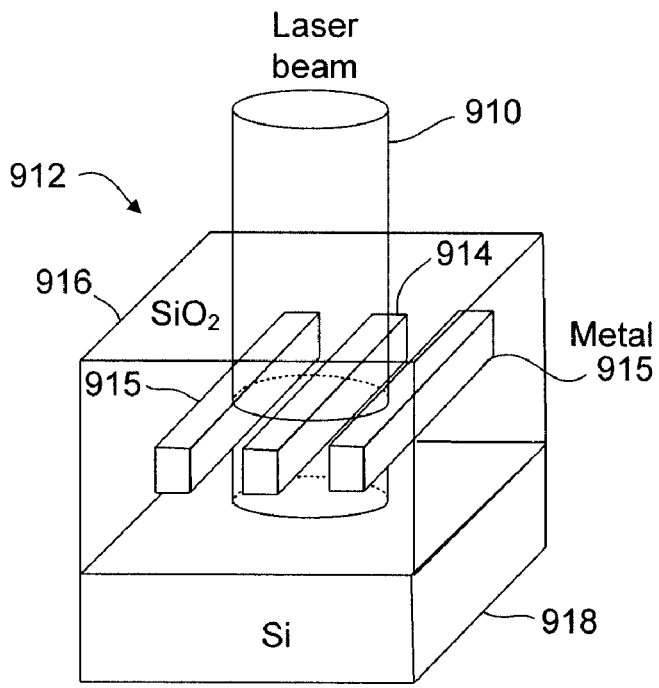
FIGS. 9A, 9B, 9C, and 9D illustrate various examples of the interaction of a laser beam with a workpiece according to certain embodiments.

FIG. 9A schematically illustrates the interaction of the laser beam 910 and the workpiece 912, which in this example includes a center metal wire 914 and two outside metal wires 915 that are each located within a silicon dioxide ($SiO_2$) layer 916 formed over a silicon (Si) substrate 918. In this example, the laser beam 910 has a wavelength of approximately 1064 nm, the metal wires 914, 915 are each approximately 300 nm thick, the distance (pitch) between the wires is approximately 1 micron, and the laser spot size is approximately 2.4 microns (the laser spot size overlaps slightly onto the adjacent wires 915.

In this example, a first pulse or burst of pulses is intended to remove the $SiO_2$ material 916 overlying the center metal wire 914, along with a portion of the center metal wire 914. Although not shown in this example, it may be understood that subsequent pulses or bursts of pulses may remove the remaining portion of the center metal wire 914. This is preferably accomplished without damaging the $SiO_2$ material 916 surrounding the outside metal wires 915, the outside metal wires 915 themselves, or the Si substrate 918.

Figures 9B, 9C, 9D:
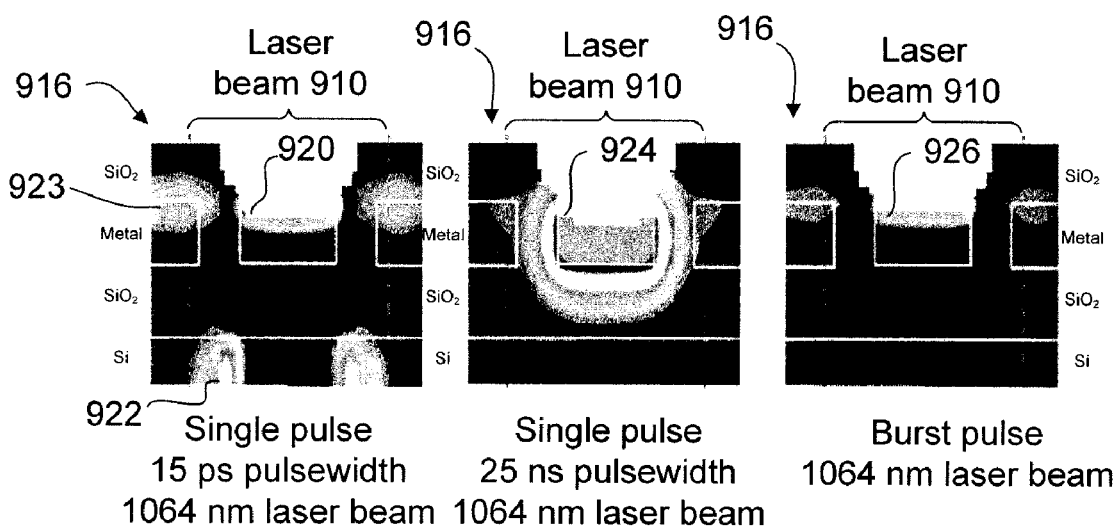

FIGS. 9B, 9C, and 9D each graphically represents a respective simulation output illustrated as two-dimensional cross-section of the workpiece 912 taken along the width of the wires 914, 915. The illustrated simulation outputs include heat affected zones shown as light regions within the workpiece 912, with more intense heat represented with correspondingly lighter shades. The illustrated simulation outputs also completely white regions over the center metal wire 914 to indicate that the corresponding material has been removed from this location.

In FIG. 9B, the illustrated simulation output is the result of applying a single laser pulse having a conventional 15 picosecond pulsewidth to the workpiece 912. As shown, the 15 picosecond conventional pulse produces relatively small heat affected zones near the wires 914, 915 and only heats the upper portion of the center wire 914. However, the large peak power for the single 15 picosecond pulse results in a significant amount of heating in the underlying Si substrate 918, as indicated by heat affected zones 922. Further, significant heating occurs in the adjacent wires 915 from exposure to the edges of the laser beam 910, as indicated by heat affected zones 923.

In FIG. 9C, the illustrated simulation output is the result of applying a single laser pulse having a conventional 25 nanosecond pulsewidth to the workpiece 912. As shown, the 25 nanosecond pulse produces a very large heat affected zone 924 (extending into the adjacent metal wires 915).

In FIG. 9D, the illustrated simulation output is the result of applying a burst of pulses to the workpiece according to the embodiments disclosed herein. As shown, applying the burst of pulses provides the most desirable result. The center wire 914 is processed with a small heat affected zone 926 with no significant heating in the Si substrate 918. In addition, heating in the adjacent wires 915 from exposure to the edges of the laser beam 910 is significantly less than that resulting from using the conventional 15 picosecond pulse shown in FIG. 9B.

It will be understood by those having skill in the art that many changes may be made to the details of the above-described embodiments without departing from the underlying principles of the invention. The scope of the present invention should, therefore, be determined only by the following claims.

The invention claimed is:

1. A laser system for processing a material with a selectively shaped burst of ultrafast laser pulses, the system comprising:
a burst pulse laser configured to emit a burst of three or more laser pulses defined by a selectively shaped burst envelope, wherein the burst pulse laser is further configured to selectively adjust temporal spacing between the three or more laser pulses within the burst envelope and the temporal width of the burst envelope; and
one or more amplifiers configured to amplify the group of three or more laser pulses so as to obtain a desired shape of the burst envelope;
wherein the burst pulse laser comprises:
a first laser source configured to emit a train of laser pulses at a first repetition rate; and
an optical modulator receiving the train of laser pulses, the optical modulator configured to amplitude modulate the train of laser pulses so as to generate the burst of three or more laser pulses defined by the selectively shaped burst envelope; and
wherein the selectively shaped burst envelope comprises a rise time in a range between approximately 10 picoseconds and approximately 1 nanosecond.

2. The laser system of claim 1, wherein the first laser source comprises an ultrafast laser source and each pulse in the train of laser pulses emitted by the first laser source comprises a temporal pulse width in a range between approximately 300 femtoseconds and approximately 1 nanosecond.

3. The laser system of claim 2, wherein the burst pulse laser is further configured to selectively adjust the temporal width of the burst envelope within a range between approximately 1 nanosecond and approximately 1 microsecond.

4. The laser system of claim 2, wherein the first repetition rate is in a range between 1 Hz and approximately 100 kHz.

5. The laser system of claim 2, wherein the first repetition rate is in a range between approximately 100 kHz and approximately 10 GHz.

6. The laser system of claim 2, wherein the ultrafast laser source comprises a distributed feedback diode.

7. The laser system of claim 2, wherein the ultrafast laser source comprises a fiber mode-locked master oscillator comprising a single mode fiber forming a laser resonator terminated on one end by a semiconductor saturable absorber mirror (SESAM) and on the other end by a wavelength selector.

8. The laser system of claim 1, wherein the burst pulse laser further comprises a pulse picker configured to provide the selectively adjustable temporal pulse spacing between the three or more laser pulses within the burst envelope.

9. The laser system of claim 8, wherein the pulse picker is selected from the group comprising an acousto-optical device and an electro-optical device.

10. The laser system of claim 1, wherein the optical modulator comprises an electro-optical modulator.

11. The laser system of claim 1, wherein the optical modulator comprises a Mach-Zehnder interferometer.

12. The laser system of claim 1, wherein the burst pulse laser further comprises a first pulse picker configured to selectively change the train of laser pulses emitted by the first laser source from the first pulse repetition rate to a second pulse repetition rate.

13. The laser system of claim 12, wherein the burst pulse laser further comprises:
a second laser source configured to emit a train of laser pulses at a third repetition rate;
a second pulse picker configured to selectively change the train of laser pulses emitted by the second laser source from the third repetition rate to a fourth repetition rate;
a beamcombiner configured to combine the train of laser pulses provided by the first pulse picker at the second pulse repetition rate with the train of laser pulses provided by the second pulse picker at the fourth pulse repetition rate, and to provide the combined laser pulse train at a combined fifth pulse repetition rate to the optical modulator; and
a controller in communication with the first pulse picker and the second pulse picker, the controller configured to synchronize the first pulse picker with the second pulse picker to thereby selectively adjust the temporal spacing between the three or more laser pulses within the burst envelope, wherein the controller selects the second pulse repetition rate and the fourth pulse repetition rate.

14. The system of claim 1, wherein the one or more amplifiers comprise:
one or more pre-amplifiers selected from the group comprising a gain fiber amplifier and a solid-state amplifier; and
one or more power amplifiers configured to further amplify the output of the one or more pre-amplifiers, the one or more power amplifiers selected from the group comprising a gain fiber amplifier and a solid-state amplifier.

15. The system of claim 1, further comprising a harmonic generator to provide wavelength conversion of the pulses within the burst envelope.

16. A method for processing a material with a selectively shaped burst of ultrafast laser pulses, the method comprising:
providing a train of laser pulses at a first repetition rate;
modulating the train of laser pulses based on a selectively shaped burst envelope, wherein the modulation includes amplitude adjusting three or more laser pulses within the burst envelope, wherein the selectively shaped burst envelope comprises a rise time in a range between approximately 10 picoseconds and approximately 1 nanosecond; and
selectively adjusting the spacing between the three or more laser pulses within the burst envelope.

17. The method of claim 16, wherein modulating further comprises selectively adjusting a temporal width of the burst envelope.

18. The method of claim 16, further comprising selectively changing the train of laser pulses from the first repetition rate to a second repetition rate.

19. The method of claim 16, further comprising converting the wavelength of the pulses within the burst envelope to different wavelengths.

* * * * *